United States Patent [19]

Tattersall, Jr.

[11] Patent Number: 5,130,663
[45] Date of Patent: Jul. 14, 1992

[54] FEED FORWARD AMPLIFIER NETWORK WITH FREQUENCY SWEPT PILOT TONE

[75] Inventor: Derek L. Tattersall, Jr., Palatine, Ill.

[73] Assignee: Motorola, Inc., Schaumburg, Ill.

[21] Appl. No.: 684,760

[22] Filed: Apr. 15, 1991

[51] Int. Cl.⁵ .......................... H03F 3/66; H03F 1/26
[52] U.S. Cl. ...................................... 330/52; 330/151
[58] Field of Search .................. 307/511; 330/52, 53, 330/107, 129, 149, 151; 455/63, 115

[56] References Cited

U.S. PATENT DOCUMENTS

| | | | |
|---|---|---|---|
| 3,815,040 | 6/1974 | Seidel | 330/149 |
| 4,219,780 | 8/1980 | Roulston et al. | 330/52 |
| 4,253,072 | 2/1981 | Fisher et al. | 330/52 X |
| 4,412,185 | 10/1983 | Gerard | 330/149 |
| 4,580,105 | 4/1986 | Myer | 330/149 |
| 4,879,519 | 11/1989 | Myer | 330/149 |
| 4,885,551 | 12/1989 | Myer | 330/52 |
| 4,994,767 | 2/1991 | Hawkes | 455/63 X |
| 5,023,565 | 6/1991 | Liev | 330/151 |

FOREIGN PATENT DOCUMENTS 2080062  1/1982  United Kingdom .

Primary Examiner—Steven Mottola
Attorney, Agent, or Firm—Val Jean F. Hillman

[57] ABSTRACT

Briefly described the present invention is a feed forward amplifier network employing a frequency swept pilot tone signal in order to reduce the distortion generated by the network's power amplifier. A frequency swept pilot tone, generated for example by a variable frequency oscillator, is injected into the input path of the power amplifier's input signal. Thereafter, distortion cancellation employed to generate an amplified output signal, substantially free of both pilot tone and the distortion signals generated by the power amplifier. The amplified output signal is then detected by a detector, phase locked to the variable frequency oscillator, in order to ascertain the average pilot tone energy remaining within the amplified output signal. In response to a detection, various amplifier network characteristics are adjusted in order to reduce the amount of pilot tone at the amplifier network output.

20 Claims, 4 Drawing Sheets

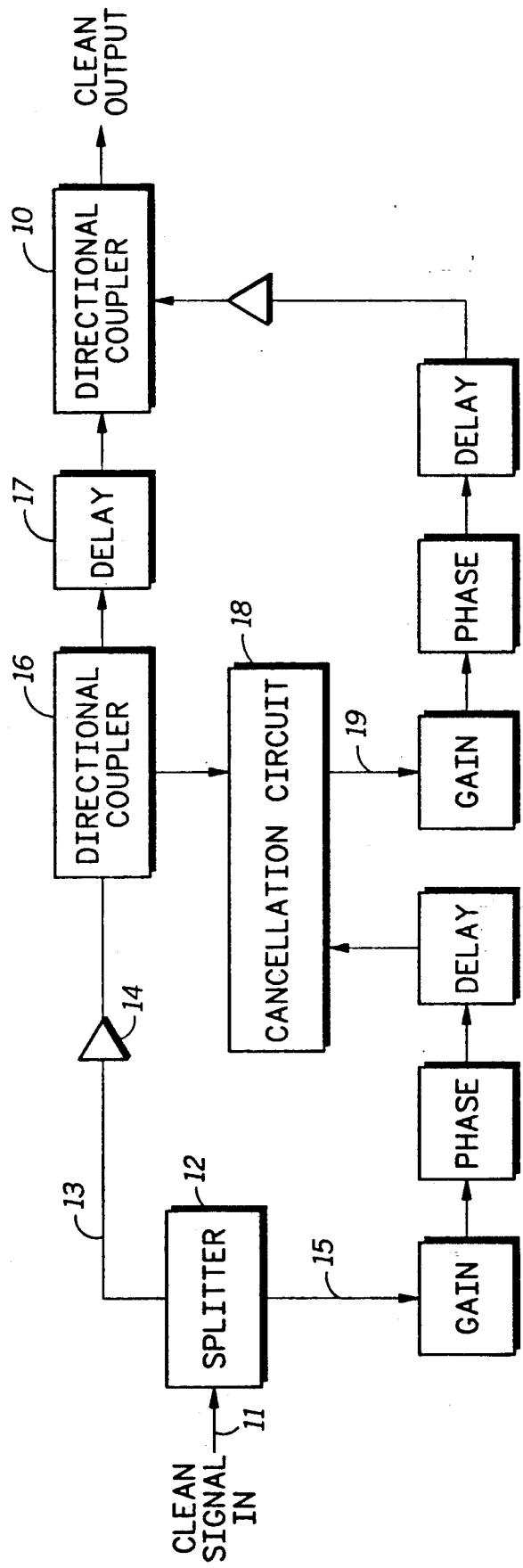
*FIG. 1A* —PRIOR ART—

FEED FORWARD AMPLIFIER NETWORK WITH FREQUENCY SWEPT PILOT TONE

FIELD OF THE INVENTION

The present invention relates generally to power amplifiers and more particularly to power amplifier networks employing feed forward to reduce the distortion generated by the power amplifier during operation.

BACKGROUND OF THE INVENTION

RF power amplifiers are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear; a perfect replica of the input signal increased in amplitude appears at the amplifier output. In reality, however, all power amplifiers have a degree of non-linearity in their transfer characteristic. This non-linearity results in the distortion of the output signal so that it is no longer a perfect replica of the input. This distortion produces spurious signal components known as intermodulation products. Intermodulation products are undesirable because they cause interference, cross talk, and other deleterious effects on the performance of a system employing the amplifier. Accordingly, the prior art reflects various methods and devices designed to reduce the distortion produced during a power amplifiers operation. Two methods commonly suggested are predistortion and feed forward.

Predistortion utilizes an auxiliary distortion source that produces an auxiliary distortion signal similar to the distortion generated by the power amplifier. The auxiliary distortion signal is added to the power amplifier input in the correct gain and phase to promote cancellation of the distortion at the power amplifier's output. This method requires matching the distortion characteristics of two dissimilar sources and hence limits the amount of correction which can be obtained.

The feed forward method does not have this limitation because it separates out that distortion generated by a power amplifier and adds it back into the power amplifier's output with gain, phase and delay adjusted for maximum cancellation. The amount of distortion reduction available using feed forward is primarily limited by the accuracy of the gain and phase adjustments.

Referring to FIG. 1A, there is shown a prior art feed forward system in block diagram form. Splitter circuit 12 divides the input signal on lead 11: one part is sent to power amplifier 14 and the other to cancellation circuit 18 via path 15. The output from power amplifier 14 includes a distortion component caused by the amplification of the input signal. A portion of the output signal from the power amplifier 14 is taken from directional coupler 16 and sent to cancellation circuit 18. The gain, phase and delay of the input signal on lead 15 is adjusted by fixed gain, phase and delay adjusters so that a portion of the input signal is cancelled when combined with the signal from directional coupler 16, to derive a distortion component on lead 19. The distortion component is adjusted by fixed gain, phase and delay adjusters, so that when the distortion component is combined with the power amplifier output, at directional coupler 10, the resultant output signal is free from distortion. The problem with this method, however, is the use of fixed gain, phase and delay adjusters which preclude the ability to adjust gain and phase parameters in response to operating point changes, such as, for example, input signal variations, voltage variations, and temperature fluctuations.

Referring to FIG. 1B, there is shown yet another prior art feed forward system which attempts to overcome the above mentioned shortcomings. A test signal, or pilot, is injected, via coupler 30, into the main signal path of power amplifier 24. The magnitude of the pilot, when detected at the amplifier output, is used by automatic control circuit 32 to adjust the gain and phase of signals on lead 29 in order to eliminate both the pilot and the distortion introduced by the power amplifier 24. The problem with this approach is that the injection of a single pilot tone fails to provide a wide-bandwidth solution to intermodulation product cancellation. In addition, the embodiment in FIG. 1B still teaches the use of fixed gain, phase and delay adjuster to provide carrier cancellation.

Referring to FIG. 1C, there is shown yet another prior art feed forward system, designed to enhance the linear transfer characteristics of an RF power amplifier. This is accomplished by comparing at 7 the input and output signals from 8 and 5 to provide a distortion signal inverted at 10 and combined at 11 with the amplified signal at 26. A reference signal 13 is injected directly into an RF power amplifier 2 so that it appears at the output terminal as though it were an amplified induced distortion. The monitor circuit 14 monitors the reference signal 13 present at the output terminal 3 and modifies the characteristics of equalizer circuit 15, so as to remove the injected reference signal from the amplified output signal at terminal 3.

Of note, the reference signal 13 is either a single reference which is adjusted successively to a desired reference frequency, or a comb of frequencies, like those typically generated by a comb generator. For the single reference signal, monitor 14 repeatedly adjusts the appropriate frequency band of equalizer 15 to each successive reference frequency in order to perform a cancellation. For the comb reference, monitor 14 is frequency selective, and therefore adjusts to respond to each particular comb frequency while the appropriate band of the equalizer 15 is adjusted.

While these approaches attempt to achieve intermodulation product cancellation over a wide range of the power amplifier's operating band, they nonetheless suffer from the shortcoming that several equalizer band adjustments must be performed before a desired degree of intermodulation cancellation is achieved. The additional time required to perform these successive adjustments adversely impacts system throughput.

It would be extremely advantageous therefore to provide a feed forward amplifier network for reducing the distortion generated by a power amplifier which is capable of providing a wide-bandwidth solution while avoiding the shortcomings of the prior art.

SUMMARY OF THE INVENTION

Briefly described the present invention is a feed forward amplifier network employing a frequency swept pilot tone signal in order to reduce the distortion generated by the network's power amplifier. In operation, a frequency swept pilot tone, generated from a reference signal, is injected into the input path of the power amplifier's input signal. Thereafter, a distortion cancellation circuit is employed to generate an amplified output signal, substantially free of both pilot tone and the distortion signals generated by the power amplifier. The amplified output signal is then detected by a detector, phase locked to the reference signal, in order to ascertain the average pilot tone energy remaining within the amplified output signal. The average pilot tone energy is amount of pilot tone energy within the amplified output signal, averaged across the power amplifier's operating bandwidth. In response to the detection, various amplifier network characteristics are adjusted in order to reduce the amount of pilot tone at the amplifier network output.

It is a first advantage of the present invention that the frequency swept pilot tone signal is a continuously variable frequency signal, as opposed to a fixed, step or comb of frequencies.

It is a second advantage of the invention that the detection of pilot tone energy is based upon the average energy across the power amplifier's operating band as opposed to detection of energy at individual frequencies.

It is another advantage of the invention that amplifier network characteristics are adjusted based upon the average pilot tone energy across the amplifier's bandwidth, as opposed to the pilot tone detection at a single or multiple fixed frequency locations.

BRIEF DESCRIPTION OF THE DRAWINGS

FIGS. 1A, 1B and 1C show feed forward amplifier networks according to the prior art.

DETAILED DESCRIPTION OF THE PREFERRED EMBODIMENT

Figure 1B:
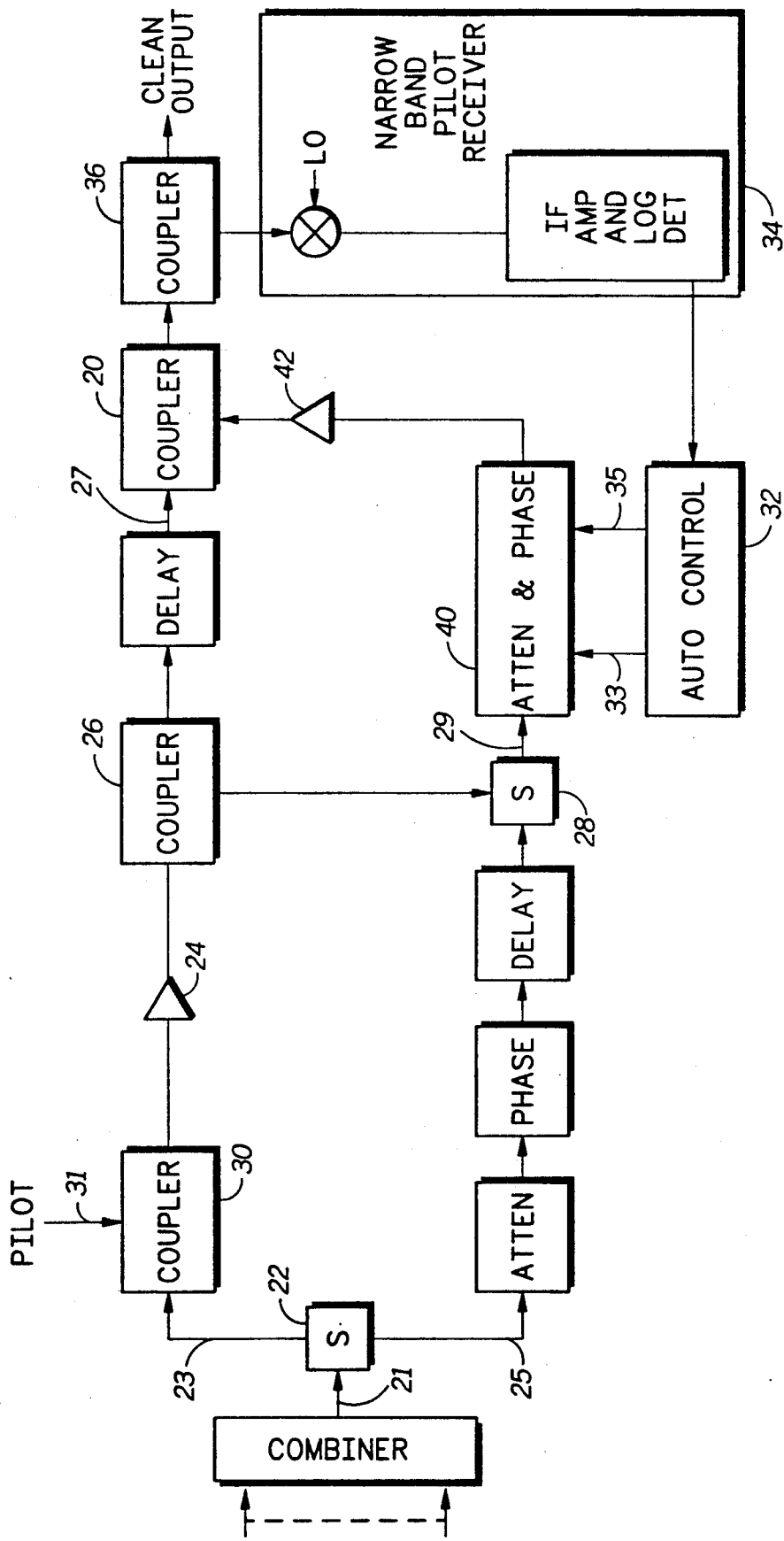
Figure 1C:
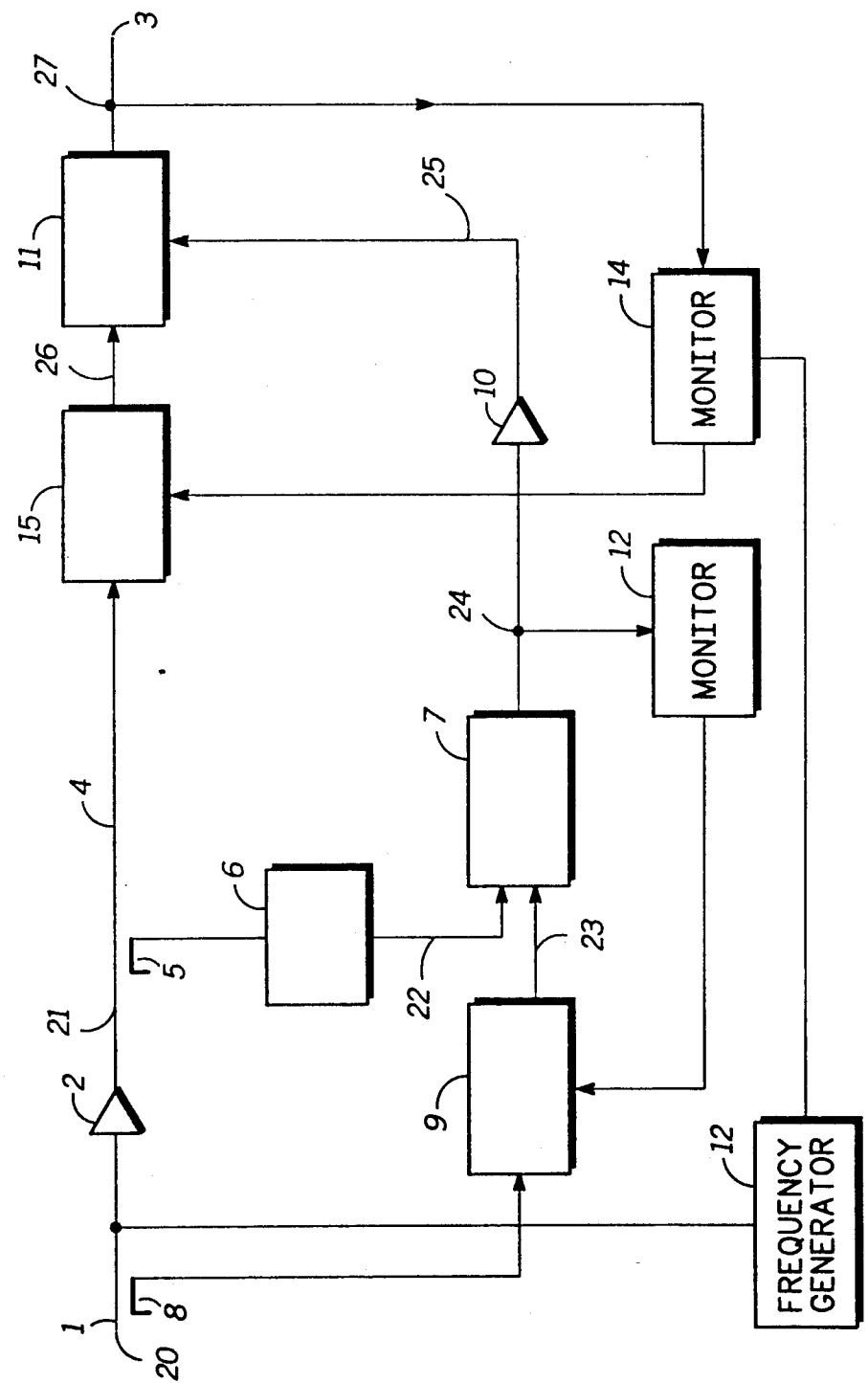
Figure 2:
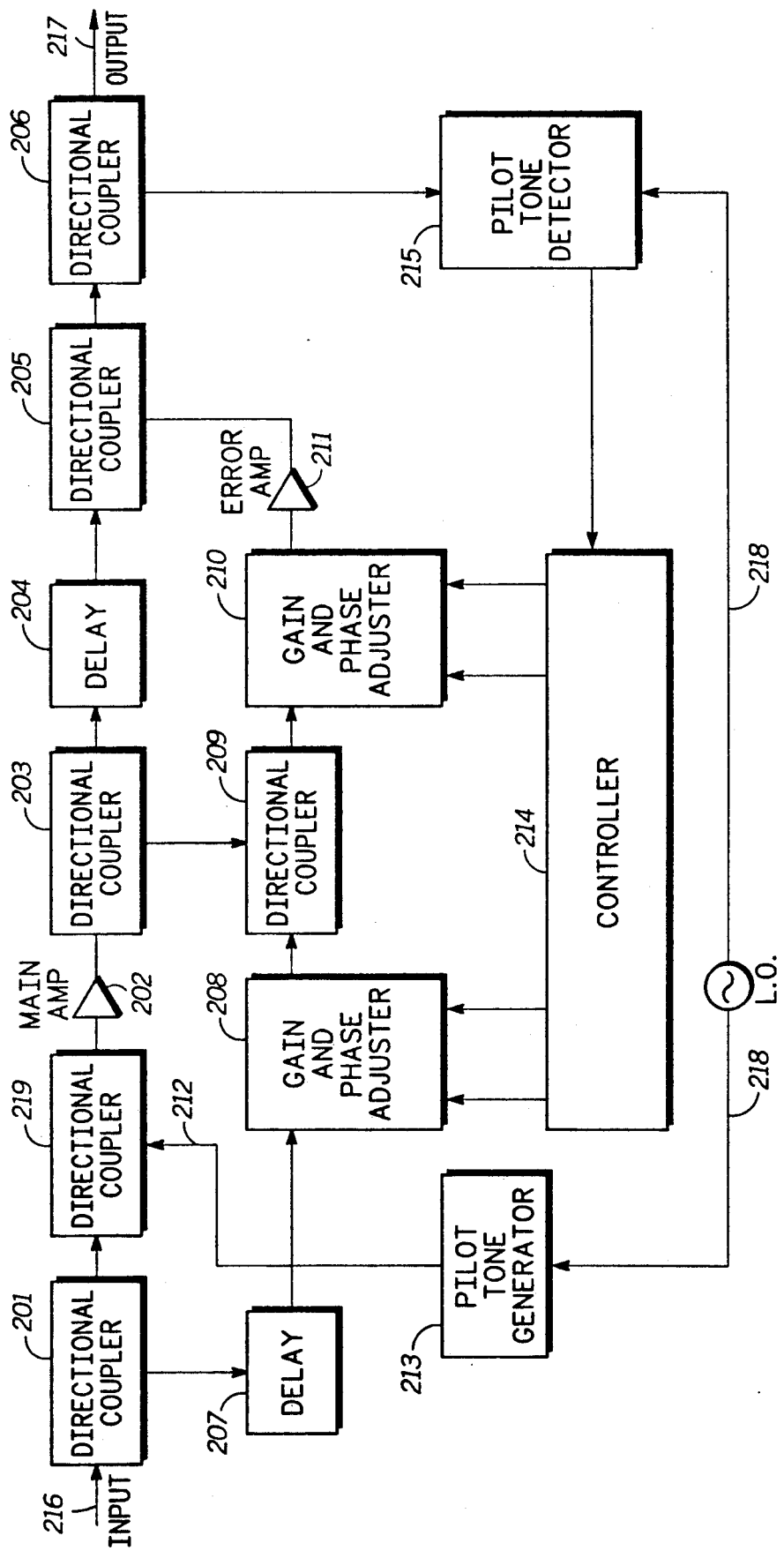
FIG. 2 shows the feed forward amplifier network according to the present invention.

Referring to FIG. 2, there is shown in block diagram form, a feed forward amplifier network 200 according to the present invention. An input signal 216, which may comprise a plurality of RF carriers, is routed between two signal paths by directional coupler 201. In one signal path, the main signal path, the input signal is amplified in main amplifier 202 and directed to output 217 through directional coupler 203, delay 204 and directional couplers 205 and 206. As previously mentioned, distortion and intermodulation components may be introduced by main amplifier 202. Therefore, the circuit of FIG. 2 is designed to remove substantially all distortion and intermodulation prior to output 217.

In this effort, input signal 200 is delayed by delay circuit 207 of the feed forward signal path, then phase and gain adjusted by phase and gain adjuster 208 without any distortion being introduced. The time delay of delay 207 is set to compensate for the signal delay through main amplifier 202 and directional coupler 203. Next, directional couplers 203 and 209 permit a portion of the signal having a distortion component to be combined with the fed forward signal. If the amplitude and the phase of the fed forward input signal is properly adjusted, the carrier components of the amplified signal from directional coupler 203 will cancel the carrier components of the fed forward input signal, resulting in an error signal at the output of directional coupler 209. This process is often referred to as carrier cancellation.

Thereafter, the amplitude and the phase of the error signal is modified in amplitude and phase adjuster 210, amplified in error amplifier 211 and routed to directional coupler 205 where it is subtracted from the output of the main amplifier 202 via directional coupler 203 and delay 204. The time delay of delay 204 is set to compensate for the signal delay through directional coupler 209, gain and phase adjuster 210 and error amplifier 11. If the amplitude and the phase of the error signal is properly adjusted, the distortion component of the main signal path will be cancelled, resulting in a clean signal at the main signal path output 217.

In order to achieve optimal distortion cancellation, gain and phase adjusters 208 and 210 must be controlled to produce a clean output signal, i.e. one that is substantially free of the distortion created by main amplifier 202. In accordance with the present invention, pilot tone generator 213 produces a frequency swept pilot tone signal 212, which is injected into the path of the input signal 216 via directional coupler 219 and delivered to the main amplifier 202. The amplitude of the pilot tone signal is controlled to be equal to the level of the distortion components generated by the main amplifier 202. Consequently, the error signal at the output of directional coupler 209 is substantially representative of the distortion components introduced by the main amplifier 202 and the pilot tone signal 212. By properly cancelling the pilot tone signal 212 within the main amplifier output path, those distortion components of equal amplitude will likewise be cancelled, thereby providing a clean output signal at 217.

In order to determine the extent of pilot tone cancellation, the present invention utilizes a pilot tone detector 215. In accordance with the preferred embodiment, detector 215 is a narrow band pilot tone receiver. In operation, detector 215 is phase locked, i.e., synchronized with the pilot tone generator 213 via the signal 218. According to the preferred embodiment, the pilot tone generator 213 is a variable frequency oscillator. This device, operating from a local clock or L.O., hereinafter referred to as the reference signal 218, is capable of generating a range of frequencies. Since the pilot tone generator 213 and the pilot tone detector 215 operate off the same reference 218, the detector 215 can readily identify pilot tone signals despite the presence of additional signals on the main amplifier output path.

As opposed to a fixed, stepped or comb of frequencies, as taught by the prior art, the frequency swept pilot tone signal 212 is characterized as a signal having a continuously varying frequency, wherein the change in frequency with respect to time is a constant. This permits the pilot tone signal of the present invention to sweep across the entire operating bandwidth of the amplifier network. In contrast, a fixed frequency pilot tone signal has but one frequency, a stepped frequency pilot tone has a variable frequency, wherein the change in frequency with respect to time is a step function, while a comb of frequencies is best characterized as a multiple fixed frequency signal. The advantage derived from utilizing a frequency swept pilot tone is the ability to provide both pilot tone and distortion cancellation across the entire operating band of the amplifier network 200.

In operation, random samples from the output from directional coupler 205, which represents the point where both distortion and pilot tone are being cancelled from the main amplifier output path, are obtained from coupler 206 and delivered to the receiver 215. These samples are averaged to determine the average pilot tone energy level within the main amplifier output path. In response to the detection, controller 214 adjusts the gain and phase characteristics of gain and phase adjusters 208 and 210 to eliminate both the pilot tone signals and the distortion introduced by the power amplifier 202.

According to the preferred embodiment controller 214 consists of an analog-to-digital converter, such as, for example, a digital voltmeter, for converting the detected pilot tone energy level into a digital representation, for use by a microprocessor, programmed to adjust the gain and phase characteristics of gain and phase adjusters 208 and 210. Under this approach, it is no longer necessary to make several gain and phase adjustments at successive frequencies before the desired degree of cancellation is achieved. Instead, by sampling the pilot tone energy level at several intervals during a frequency sweep and averaging those values together to determine an average pilot tone energy level for the entire sweep, cancellation of both pilot tone and distortion over the whole of the amplifier network's operating band is achieved at the same time.

The invention has been described with reference to an illustrative embodiment. It will be apparent to one skilled in the art, however, that various modifications can be made without departing from the spirit and scope of the invention. For example, FIG. 2 depicts a circuit wherein a single carrier cancellation loop is employed. It will be appreciated by those skilled in the art that nested or cascaded carrier cancellation loops are an obvious modification. In addition, controller 214 need not be a microprocessor controlled device, while the detector 215 may be any of several well known narrow-band RF detectors or frequency selective receivers.

What is claimed is:

1. A feed forward amplifier network for reducing distortion generated by a power amplifier comprising:
   means for generating a frequency swept pilot tone as a function of a reference signal, wherein the frequency swept pilot tone is injected into the input path of a power amplifier's input signal;
   circuit means, coupled to the power amplifier, for generating an amplified output signal, substantially free of the pilot tone and power amplifier distortions;
   means, coupled to the circuit means, for detecting an average pilot tone energy level within the amplified output signal; and
   means, coupled to the detecting means, for adjusting circuit means characteristics to reduce the amplitude of the pilot tone energy level within the amplified output signal.

2. The feed forward amplifier network of claim 1 wherein the means for generating the frequency swept pilot tone is a variable frequency oscillator.

3. The feed forward amplifier network of claim 1 wherein the reference signal is the variable frequency oscillator's local oscillation rate.

4. The feed forward amplifier network of claim 1 wherein the frequency swept pilot tone is a continuously varying frequency signal, as opposed to a single or multiple fixed frequency signal.

5. The feed forward amplifier network of claim 1 wherein changes in pilot tone frequency with respect to time are constant during a frequency sweep.

6. The feed forward amplifier network of claim 1 wherein the circuit means further comprises:
   a first cancellation means, coupled to the power amplifier, for generating an error signal representative of the frequency swept pilot tone and the distortion generated by the power amplifier; and
   a second cancellation means, coupled to the first cancellation means, for combining an amplified error signal with a power amplifier output signal to generate the amplified output signal.

7. The feed forward amplifier network of claim 1 wherein the detecting means is a device selected from the group of detectors consisting of:
   frequency selective receivers; and
   narrow band RF power detectors.

8. The feed forward amplifier network of claim 1 wherein the detecting means is phase locked to the reference signal.

9. The feed forward amplifier network of claim 1 wherein the adjusting means adjusts the amplitude and the phase of the input signal and the error signal in response to an average pilot tone energy level detected within the amplified output signal.

10. The feed forward amplifier network of claim 9, wherein the average pilot tone energy is determined as a function of a plurality of pilot tone energy samples taken during a frequency sweep.

11. The feed forward amplifier network of claim 1 wherein the adjusting means is a device selected from the group of adjusters consisting of:
   variable phase and gain adjusters; and
   variable equalizers.

12. A feed forward amplifier network for reducing the distortion generated by a power amplifier comprising:
   means for generating a frequency swept pilot tone as a function of a reference signal, wherein the frequency swept pilot tone is injected into the input path of a power amplifier's input signal;
   circuit means, coupled to the power amplifier, for generating an amplified output signal, substantially free of the pilot tone and power amplifier distortions;
   means, coupled to the circuit means, and synchronized to the reference signal, for detecting an average pilot tone energy level within the amplified output signal; and
   means, coupled to the synchronized detecting means, for adjusting circuit means characteristics to reduce the amplitude of the pilot tone energy level within the amplified output signal.

13. A feed forward amplifier network for reducing the distortion generated by a power amplifier comprising:
   means for generating a frequency swept pilot tone as a function of a reference signal, wherein the frequency swept pilot tone is injected into the input path of a power amplifier's input signal;
   circuit means, coupled to the power amplifier, for generating an error signal representative of the pilot tone and the distortion generated by the power amplifier;
   means, coupled to the circuit means, for combining an amplified error signal with a power amplifier output signal to generate an amplified output signal, substantially free of pilot tone and distortion;
   means, coupled to the combining means, and phase locked to the reference signal, for detecting an average pilot tone energy within the amplified output signal, wherein the pilot tone energy is averaged across the power amplifier's bandwidth; and means, coupled to the phase locked detecting means, for adjusting the amplitude and the phase of the input signal and the error signal, in response to the average pilot tone energy, to reduce the amplitude of the pilot tone energy at the power amplifier network output.

14. A method for reducing the distortion generated by a power amplifier network comprising the steps of:
   injecting a frequency swept pilot tone into an input path of a power amplifier network's input signal;
   generating an amplified output signal, substantially free of pilot tone and power amplifier distortions;
   detecting an average pilot tone energy level within the amplified output signal; and
   adjusting power amplifier network characteristics in response to the average pilot tone energy level in order to reduce the amplitude of the pilot tone energy within the amplified output signal.

15. The method of claim 14 wherein the frequency swept pilot tone is generated by a variable frequency oscillator.

16. The method according to claim 14 wherein changes in pilot tone frequency with respect to time are constant, throughout a frequency sweep.

17. The method of claim 14 wherein the step of generating the amplified output signal further comprises the steps of:
   comparing the power amplifier's output signal with the input signal to produce an error signal representative of the frequency swept pilot tone and the distortion generated by the power amplifier; and
   combining an amplified error signal with the power amplifier's output signal to generate the amplified output signal.

18. The method of claim 14 wherein the step of detecting the average pilot tone energy level further comprises the steps of:
   sampling pilot tone energy levels at a plurality of intervals during a frequency sweep; and
   averaging the plurality of pilot tone energy levels.

19. The method of claim 14 wherein the amplifier network characteristics include, but are not limited to:
   input signal phase and amplitude,
   error signal phase and amplitude, and
   amplified error signal phase and amplitude.

20. A method for reducing the distortion generated by a power amplifier comprising the steps of:
   generating a frequency swept pilot tone signal as a function of a reference signal;
   injecting the frequency swept pilot tone signal into the input path of a power amplifier's input signal;
   comparing a power amplifier output signal with the input signal to produce an error signal representative of the frequency swept pilot tone signal and the distortion generated by the power amplifier;
   combining an amplified error with the power amplifier output signal to generate an amplified output signal, substantially free of pilot tone and distortion signals;
   detecting an average pilot tone energy level within the amplified output signal as a function of the reference signal; and
   adjusting the amplitude and the phase of the input signal and the error signal in response to the average pilot tone energy level, to reduce the amplitude of the pilot tone energy within the amplified output signal.

* * * * *